(12) United States Patent
Frank

(10) Patent No.: US 6,489,862 B1
(45) Date of Patent: Dec. 3, 2002

(54) METHOD FOR REDUCING NOISE GENERATED IN A POWER AMPLIFIER

(75) Inventor: Michael L. Frank, Los Gatos, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/678,954

(22) Filed: Oct. 3, 2000

(51) Int. Cl.[7] .................. H03F 3/68; H03F 3/24; H03H 9/00; H03H 9/54

(52) U.S. Cl. ............... 333/187; 330/302; 330/306; 330/310; 333/189; 455/78

(58) Field of Search ................ 333/124, 133, 333/187, 32, 189; 330/302, 306, 310; 455/78, 73

(56) References Cited

U.S. PATENT DOCUMENTS

| | | | |
|---|---|---|---|
| 4,792,939 A | * 12/1988 | Hikita et al. | 370/24 |
| 5,051,706 A | 9/1991 | Zushi | 330/277 |
| 5,438,683 A | 8/1995 | Durtler et al. | 455/74 |
| 6,078,794 A | * 6/2000 | Peckham et al. | 330/306 X |
| 6,111,459 A | * 8/2000 | Nishijima et al. | 330/51 |
| 6,122,491 A | 9/2000 | Francisco | 455/127 |
| 6,144,260 A | * 11/2000 | Hashimoto et al. | 330/306 |
| 6,188,877 B1 | * 2/2001 | Boesch et al. | 455/74 |

FOREIGN PATENT DOCUMENTS

| | | | | |
|---|---|---|---|---|
| EP | 0862266 A2 | | 11/1997 | |
| JP | 4-306922 | * | 10/1992 | 455/73 |
| JP | 2000-138546 | * | 5/2000 | |
| WO | WO 96/42134 | * | 12/1996 | |
| WO | WO0024124 | | 4/2000 | |

* cited by examiner

Primary Examiner—Robert Pascal
Assistant Examiner—Barbara Summons

(57) ABSTRACT

Receive band filtering between the last two stages of an N-stage power amplifier can reduce the $R_x$ band noise. There are N-1 interstage matching networks interposing N stage amplifiers, where $N \geq 2$. The interstage matching networks and stage amplifiers are electrically connected in series. The $N-1^{th}$ interstage matching network includes a receive band reject filter positioned proximate to the output of the $N-1^{th}$ stage power amplifier.

19 Claims, 7 Drawing Sheets

METHOD FOR REDUCING NOISE GENERATED IN A POWER AMPLIFIER

FIELD OF THE INVENTION

The invention is related to the field of power amplifiers, particularly towards noise reduction in the power amplifiers.

BACKGROUND

In a full duplex transceiver, both the transmitter and the receiver can operate simultaneously. This results in two forms of interference. The first interference is the $T_x$ (transmit) band power getting into the receiver. The second interference is noise generated in the $R_x$ (Receive) band by the $T_x$ portion of the radio, and leaking into the $R_x$ portion of the transceiver. Both types of interference are mitigated by using a duplexer. In this instance, a duplexer is a three port, passive element consisting of a pair of bandpass filters and supporting components. One filter passes the $T_x$ frequencies and rejects the $R_x$, the other passes the $R_x$ and rejects the $T_x$.

As the transmit ($T_x$) power is not completely blocked by the duplexer, the power can enter the receiver thus causing distortion. In a filter-based duplexer, this is a measure of how well the receive ($R_x$) filter rejects the transmit $T_x$ band power. The $T_x$ filter has no effect because the leakage is in the pass-band of the $T_x$ filter.

The second interference is caused by noise in the $R_x$ band, generated by the $T_x$ circuitry getting by the duplexer into the receiver. This causes a loss of sensitivity. In a filter-based duplexer, this is a measure of how well the $T_x$ filter can reject the $R_x$ band power. The $R_x$ filter has no effect upon this leakage because it is in the pass-band of the $R_x$ filter. This type of crosstalk drives the design of the $T_x$ chain. The sensitivity required of the receiver dictates how much leakage is acceptable. The rejection of the duplexer dictates how much noise power the $T_x$ chain can be allowed to generate.

The noise figure of an amplifier is a sum of all of its noise sources, referenced to the input of the amplifier. The noise power at the output of that amplifier is the sum of the gain of the amplifier and the noise figure. Since the sensitivity required by the $R_x$ branch of the transceiver is set, the allowable noise power out of the $T_x$ branch effectively sets the maximum gain of the power amplifier.

In full duplex handsets, there is another constraint. The gain setting routine discussed above relies upon the $R_x$ noise at the input to the power amplifier be at or near the noise floor available at that temperature. The noise generated in the $T_x$ chain previous to the power amplifier must be sufficiently rejected to not increase the noise power at the output of the power amplifier. This is accomplished by inserting a $R_x$ band reject filter just in front of the power amplifier, in the $T_x$ band signal path. The difficulty of building this type of $R_x$ rejection filter is such that many handsets rely upon two filters in parallel, each filter dealing with half the signal bandwidth, adding half the pass-band to the reject band frequency. This makes each filter of the pair much easier than a full band implementation. The input signal is routed through a switch, then into one of the filter pair. After the filter, the signal is then recombined with a switch.

One prior art implementation, shown in FIG. 1, includes a $R_x$ rejection filter in front of a two-stage power amplifier. Given that this node is at or near the noise floor, and given the amount of noise generated in the power amplifier, the amount of $R_x$ rejection required in the duplexer can be specified. The duplexer filter that implements the required rejection has an associated insertion loss. This loss is in the $T_x$ band, and is dependent upon the $R_x$ band rejection. Hence, the more rejection required, the higher the loss in the $T_x$ band.

Since the power output of the handset is constant, higher loss in the duplexer requires more power out of the power amplifier. At the high power levels required, higher power requires more current, thus, reducing battery life.

SUMMARY

Receive band filtering between the last two stages of an N-stage power amplifier can reduce the $R_x$ band noise. There are N−1 interstage matching networks interposing N stage amplifiers, where N greater than or equal to 2. The interstage matching networks and stage amplifiers are electrically connected in series. The N−1$^{th}$ or ultimate interstage matching network includes a $T_x$ band filter positioned proximate to the output of the penultimate or N−1$^{th}$ stage power amplifier.

DETAILED DESCRIPTION OF THE DRAWINGS

In the present invention, the $R_x$ band noise dependency upon the $T_x$ chain is reduced so that the duplexer rejection requirement may be relaxed. As the loss is less, less power is required from the power amplifier. This is turn requires less current and results in longer battery life.

Figure 1:
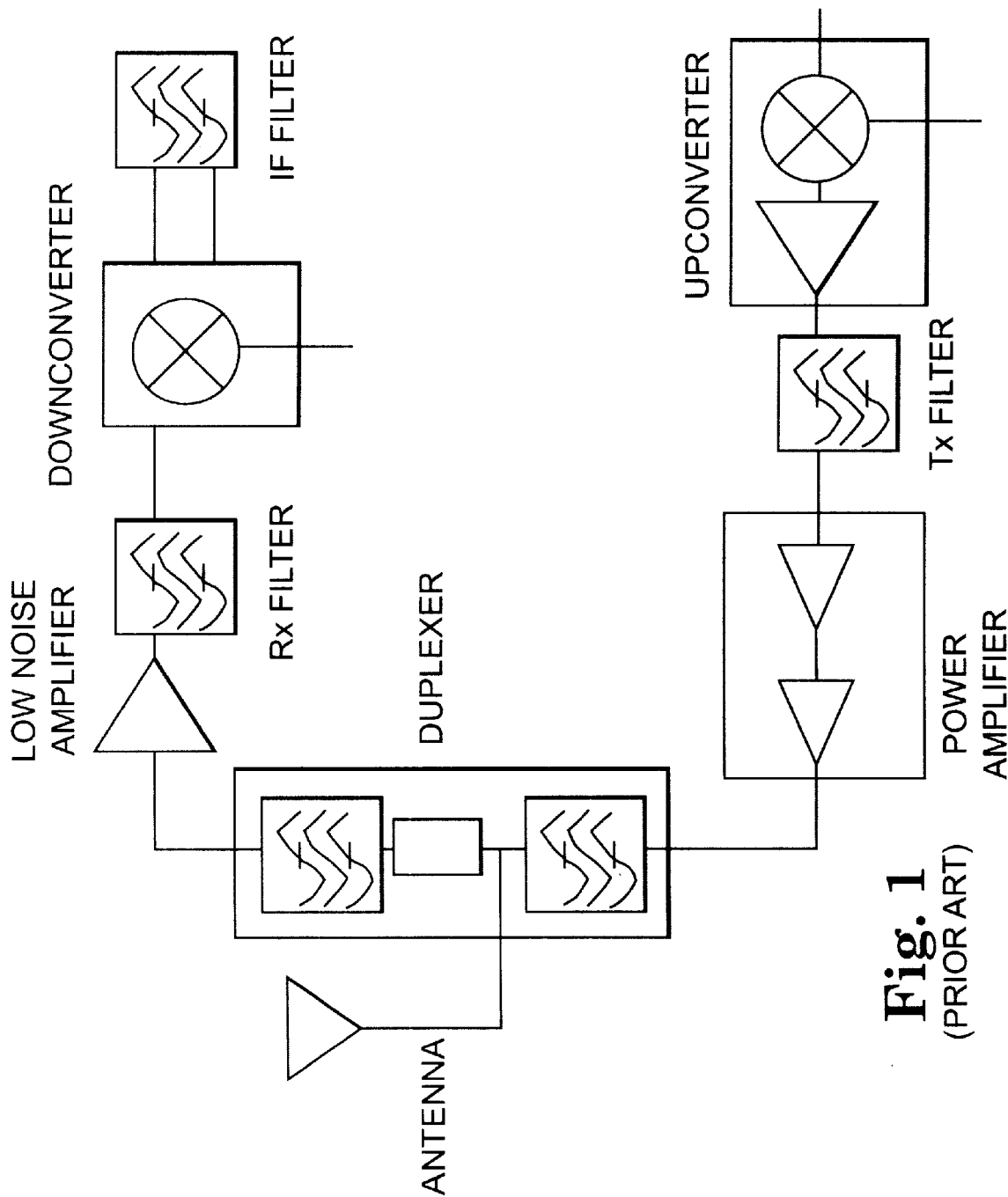
FIG. 1 illustrates a functional block diagram for a full duplex transceiver of the prior art.
Figure 2:
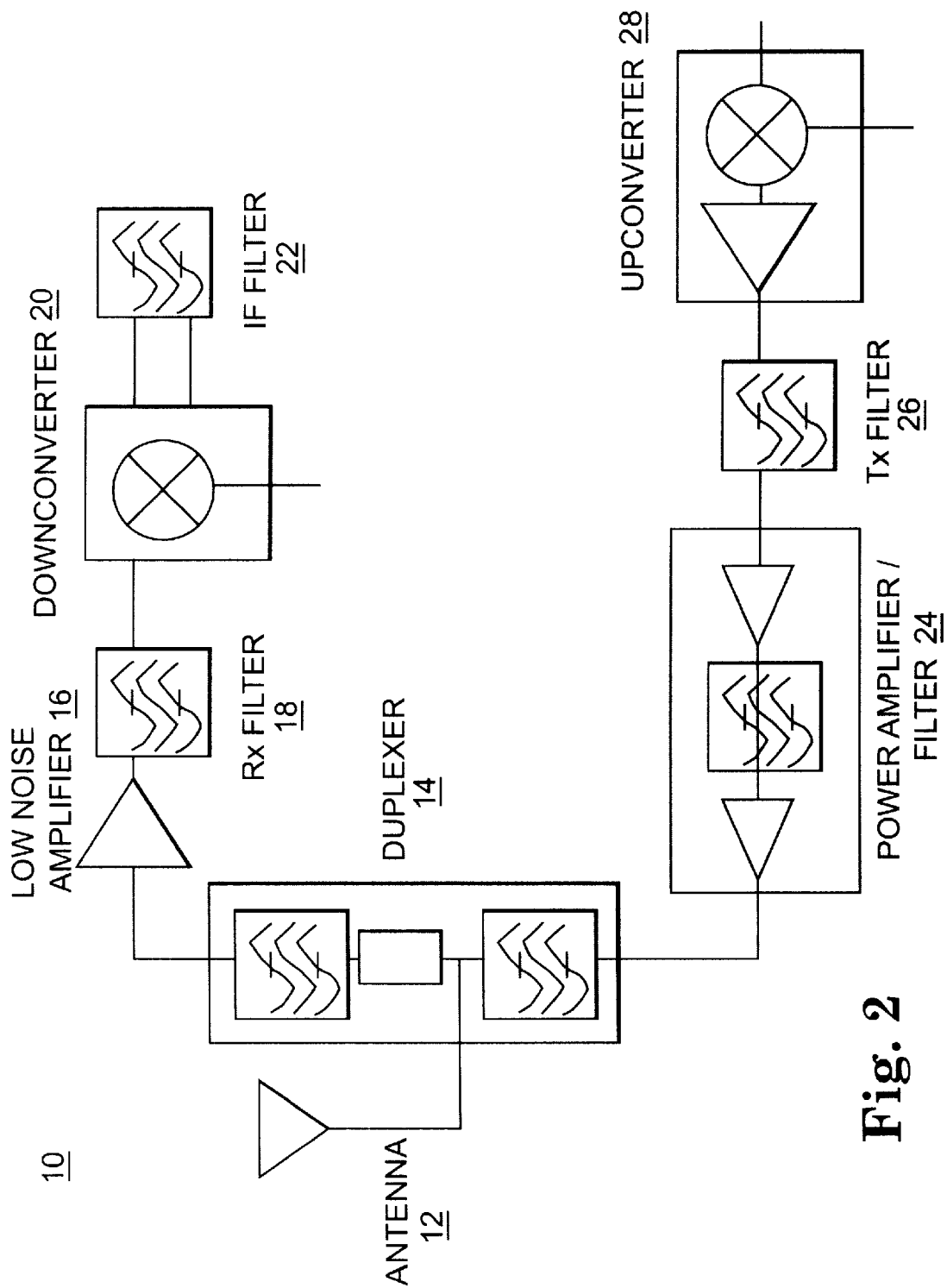
FIG. 2 illustrates a functional block diagram for a full duplex transceiver of the present invention.

Filtering between the two stages of the power amplifier can reduce the $R_x$ band noise. In particular, either a band reject or a bandpass filter that rejects the $R_x$ band will reduce the noise power. FIG. 2 illustrates a transceiver 10 using an N-stage power amplifier of the present invention, where N≧2. An antenna 12 is connected to a duplexer 14. The duplexer 14 receives data from antenna 12 and transmits it to low noise amplifier (LNA) 16. A receive $R_x$ filter 18 is connected between LNA 16 and a downconverter 20. An IF filter 22 receives the output of downconverter 20. The duplexer 12 transmits data received from a power amplifier/filter 24. A transmit $T_x$ filter 26 connects between power amplifier/filter 24 and an upconverter 28.

Figure 3:
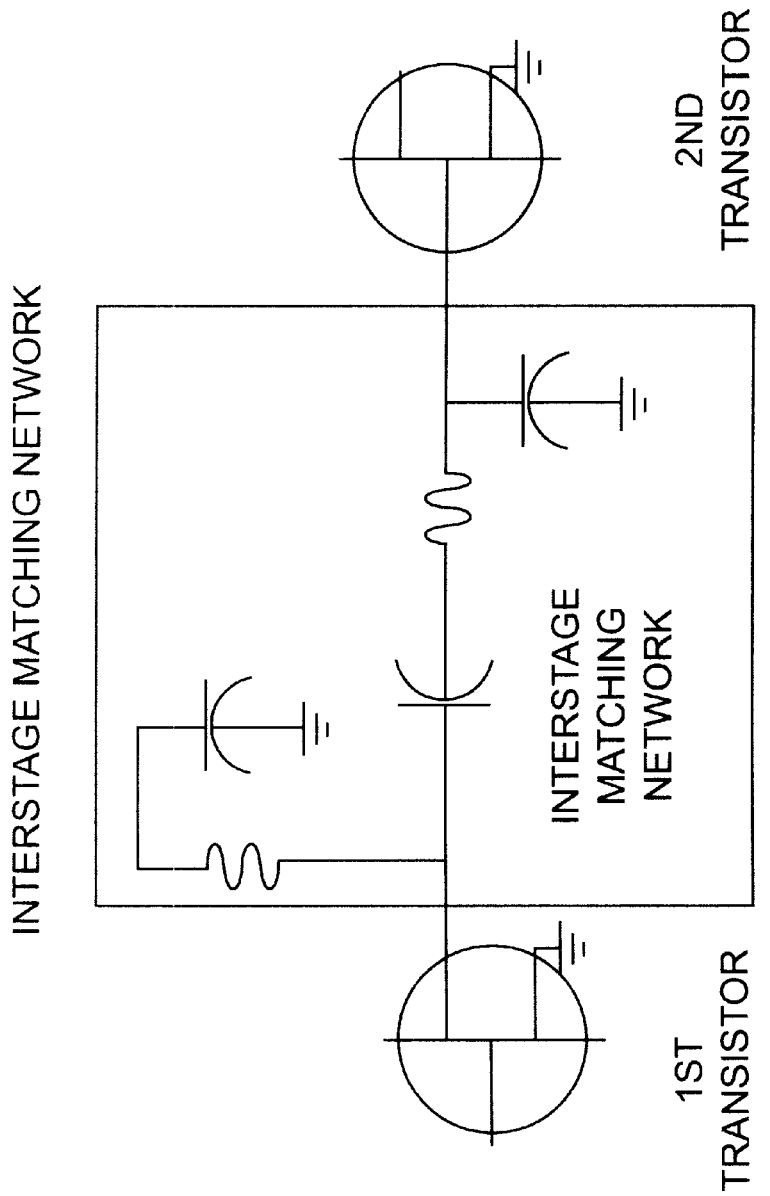
FIG. 3 illustrates a functional block diagram for a power amplifier using a prior art interstage matching network.

FIG. 3 illustrates a two-stage amplifier of the prior art. The interstage matching network is an RLC network.

Figure 4:
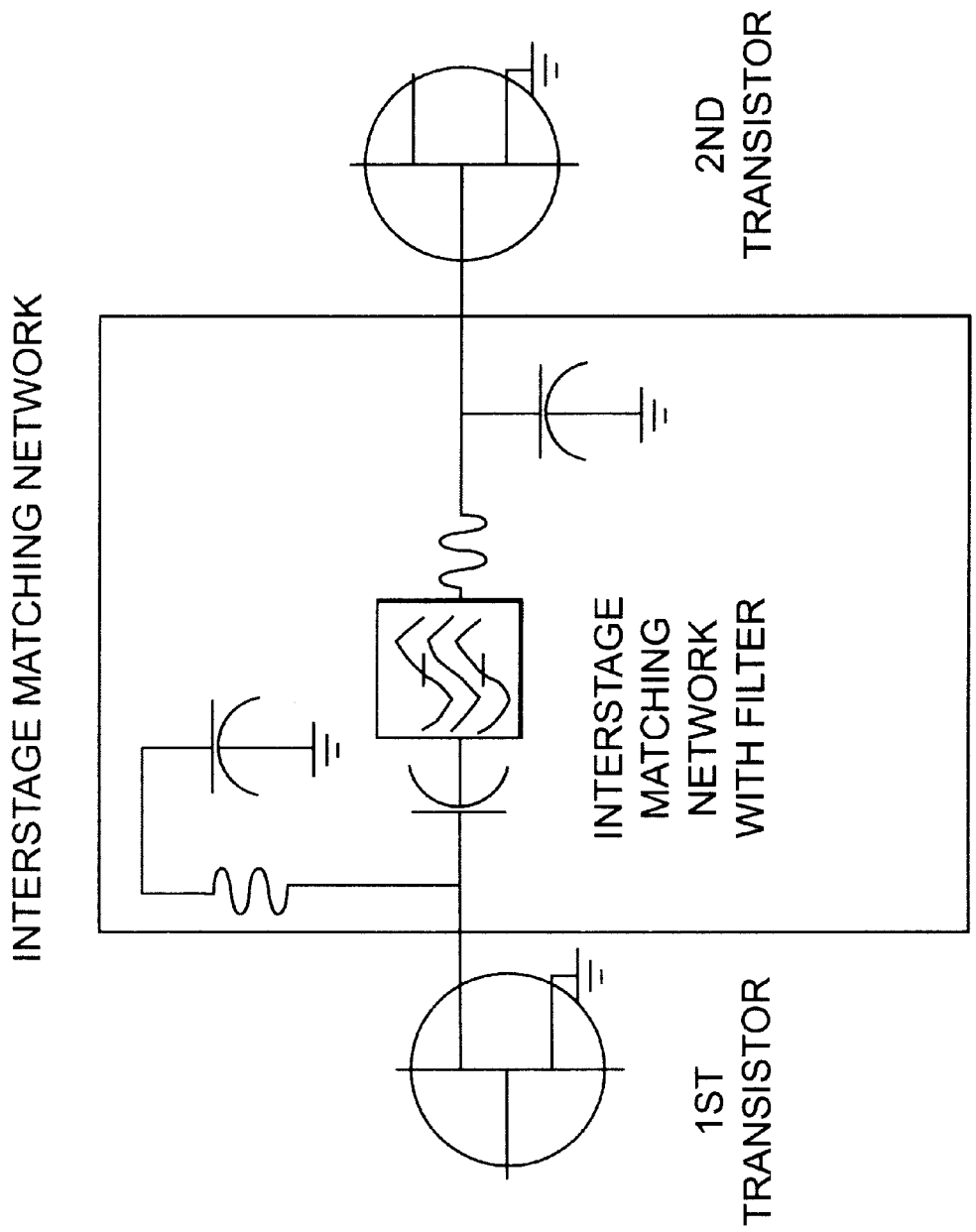
FIG. 4 illustrates a functional block diagram for a power amplifier/filter 24 shown in FIG. 2.

FIG. 4 illustrates a novel power amplifier/filter 24, as shown in FIG. 2. While a two-stage power amplifier is illustrated, this concept as will be described is easily extended to cover a N-stage power amplifier. In this illustration, N equals 2. There are N-1 interstage matching networks interposing N stage amplifiers. The interstage matching networks and stage amplifiers are serially connected. The N-1$^{th}$ interstage matching network includes a receive band filter positioned proximate to the output of the N-1$^{th}$ stage power amplifier.

The N-1$^{th}$ interstage matching network has very low impedance. The receive band filter is designed to operate at the required impedance. The illustrative filter operates in a 6Ω network. Approximately, 10 dB of net rejection results in about 10 dB reduction in the output $R_x$ band noise power. The receive band filter may be a surface acoustic wave filter, a film bulk acoustic resonator (FBAR) filter, a ceramic filter, or a piezo-electric based filter.

Figure 5:
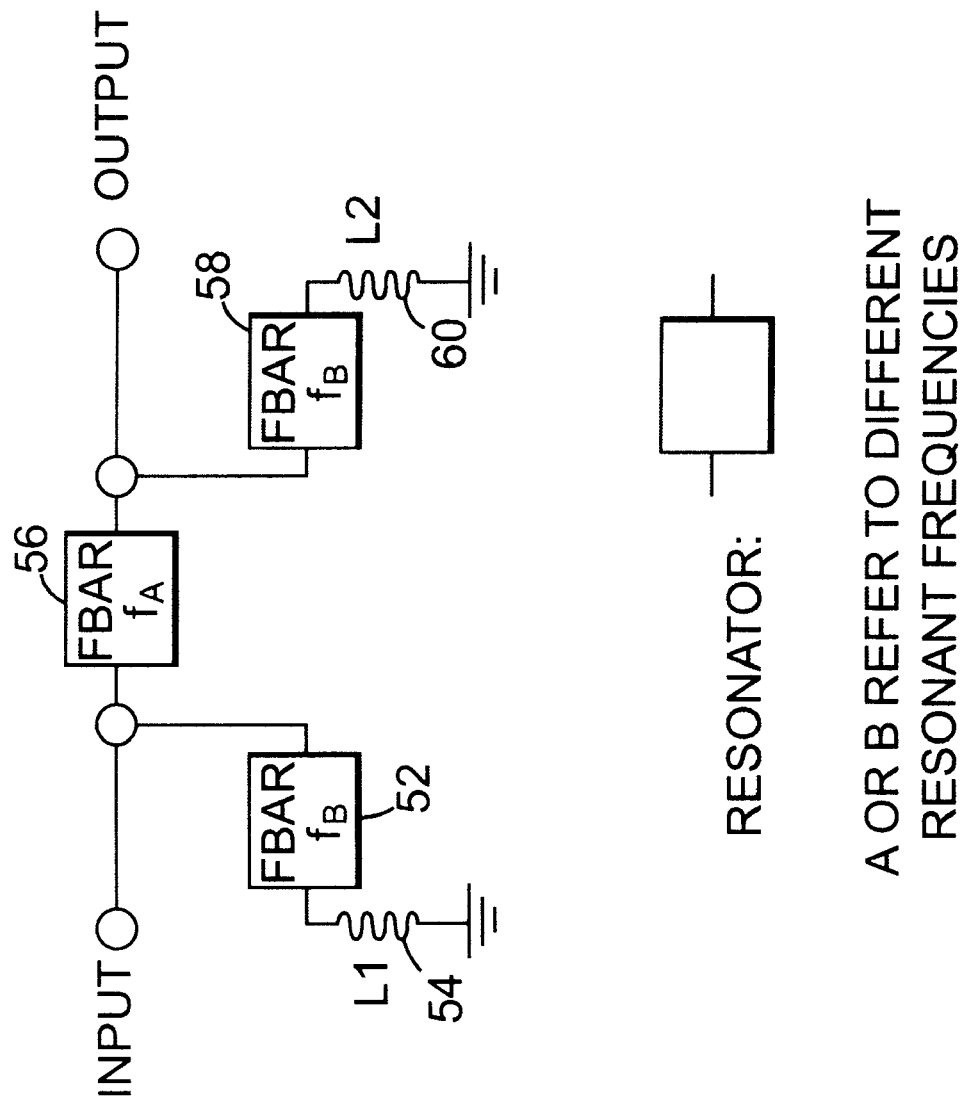
FIG. 5 illustrates an interstage matching network of the present invention shown in FIG. 4.

FIG. 5 illustrates a preferred embodiment of the interstage matching network shown in FIG. 4. A first FBAR 52 is serially connected between the input and a first inductor 54 is tied to ground. A second FBAR 56 is connected between the input and output. A third FBAR 58 is connected between the output and a second inductor 60 that is tied to ground. The first and third FBARS 52, 58 have one resonant frequency while the second FBAR 56 has another resonant frequency.

Figure 6:
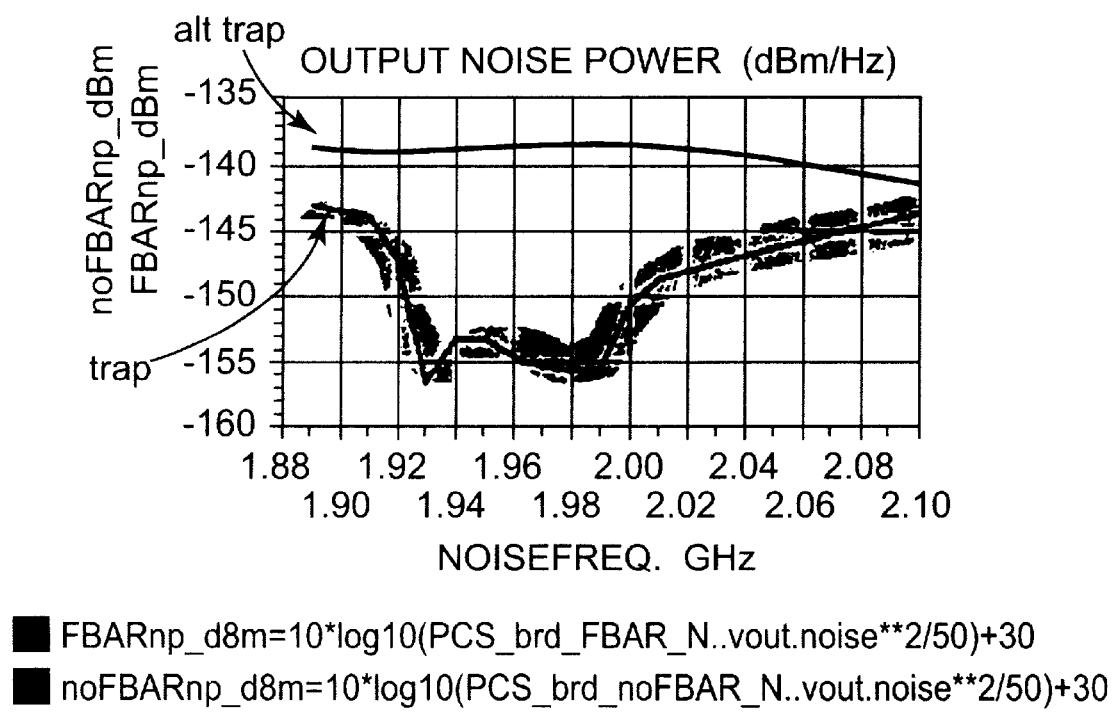
FIG. 6 illustrates noise reduction for a two-stage power amplifier using a receive band reject filter in the interstage matching network.

FIG. 6 shows the noise reduction for a two stage power amplifier using the receive band filter shown in FIG. 4 in the N-1$^{th}$ interstage matching network.

Figure 7:
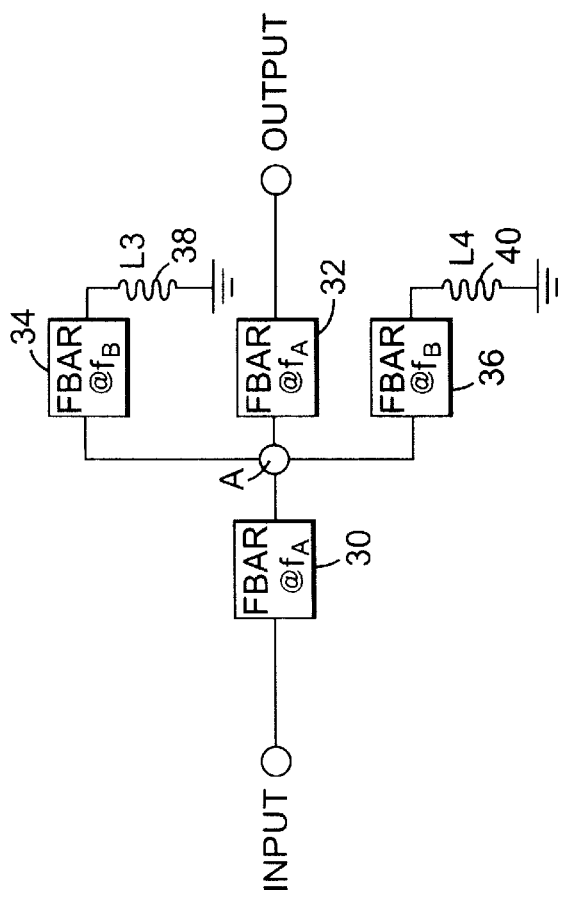
FIG. 7 illustrates another preferred embodiment of the interstage matching network shown in FIG. 4.

FIG. 7 illustrates another preferred embodiment of the interstage matching network shown in FIG. 4. At node A, a first FBAR 30 is connected between the input and second FBAR 32 that is connected to the output. A third and a fourth FBAR 34, 36 are connected to node A. An inductor 38 is connected between the third FBAR 34 and ground. Another inductor 40 is connected between the fourth FBAR 36 and ground. The first and second FBARS 30, 32 have one resonant frequency while the third and fourth FBARS 34, 36 have a different resonant frequency.

Figure 8:
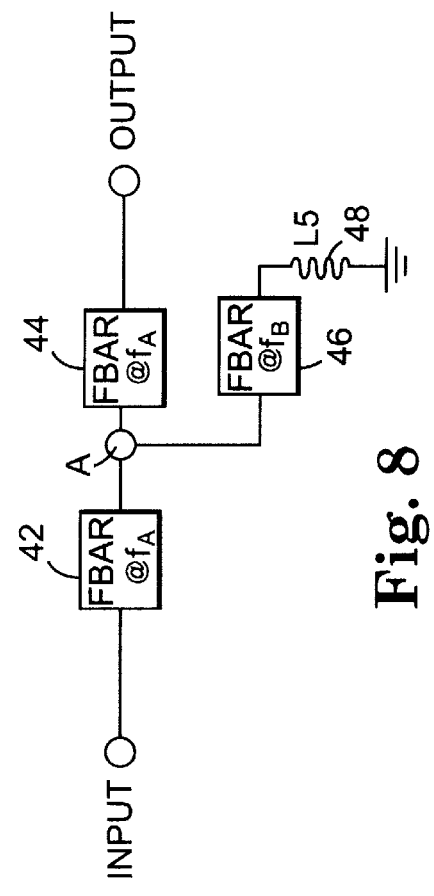
FIG. 8 illustrates another preferred embodiment of the interstage matching network shown in FIG. 4.

FIG. 8 illustrates another preferred embodiment of the interstage matching network shown in FIG. 4. At node A, a first FBAR 42 is connected between the input and second FBAR 44 that is connected to the output. Between node A and ground, a third FBAR 46 is serially connected to an inductor 48. The first and second FBARs 42, 44 have one resonant frequency while the third FBAR 46 has a different resonant frequency.

I claim:

1. A power amplifier comprising:
    a series of N stage amplifiers, where N>2;
    a series of N-1 interstage networks interposing the series of N stage amplifiers, wherein the series of N-1 interstage networks and series of N stage amplifiers are electrically connected in series; and
    wherein the N-1$^{th}$ interstage network includes a receive band reject filter positioned proximate to the output of the N-1$^{th}$ stage amplifier.

2. A power amplifier, as defined in claim 1, wherein the receive band reject filter is selected from a group that includes surface acoustic wave filters, film bulk acoustic resonators filters, ceramic filters, and piezo-electric based filters.

3. A power amplifier, as defined in claim 1, wherein the N-1$^{th}$ interstage network has an input impedance that approximates the output impedance of the N-1$^{th}$ stage amplifier and has an output impedance that approximates the input impedance of the N$^{th}$ stage amplifier.

4. A power amplifier, as defined in claim 3, wherein the receive band reject filter has an impedance that is between the output impedance of the N-1$^{th}$ stage amplifier and The input impedance of the N$^{th}$ stage amplifier.

5. A power amplifier, as defined in claim 4, the receive band reject filter further comprising:
    a first film bulk acoustic resonator connected between the input of the Nth stage amplifier and the output of the N-1$^{th}$ stage amplifier;
    a second film bulk acoustic resonator connected to the input;
    a first inductor connecting between the second film bulk acoustic resonator and ground;
    a third film bulk acoustic resonator connected to the output of the N-1$^{th}$ stage amplifier; and
    a second inductor connecting between the third film bulk acoustic resonator and ground.

6. A power amplifier, as defined in claim 4, the receive band reject filter further comprising:
    a first film bulk acoustic resonator connected to the input of the Nth stage amplifier;
    two paths, connected between the first film bulk acoustic resonator and ground, each path including a film bulk acoustic resonator serially connected to an inductor; and
    a second film bulk acoustic resonator connected between the first film bulk acoustic resonator and the output of the N-1$^{th}$ stage amplifier.

7. A power amplifier, as defined in claim 4, the receive band reject filter further comprising:
    a first film bulk acoustic resonator connected to the input of the Nth stage amplifier;
    a film bulk acoustic resonator serially connected to an inductor, connected between the first film bulk acoustic resonator and ground; and
    a second film bulk acoustic resonator connected between the first film bulk acoustic resonator and the output of the N-1$^{th}$ stage amplifier.

8. A power amplifier, as defined in claim 1, wherein the receive band reject filter is selected from a group that includes film bulk acoustic resonator filters, ceramic filters, and piezo-electric based filters.

9. A power amplifier, as defined in claim 1, wherein the receive band reject filter comprises a plurality of film bulk acoustic resonators.

10. A power amplifier comprising:
    a series of N stage amplifiers, where N≥2;
    a series of N-1 interstage networks interposing the series of N stage amplifiers, wherein the series of N-1 interstage networks and series of N stage amplifiers are electrically connected in series; and
    wherein the N-1th interstage network includes a receive band reject filter positioned proximate to the output of the N-1th stage amplifier, the receive band reject filter comprising:
        a first film bulk acoustic resonator connected between the input of the Nth stage amplifier and the output of the N-1th stage amplifier;
        a second film bulk acoustic resonator connected to the input;
        a first inductor connecting between the second film bulk acoustic resonator and ground;
        a third film bulk acoustic resonator connected to the output of the N-1th stage amplifier; and a second inductor connecting between the third film bulk acoustic resonator and ground.

11. The power amplifier of claim 10, wherein the N−1$^{th}$ interstage network has an input impedance that approximates the output impedance of the N−1$^{th}$ stage amplifier and has an output impedance that approximates the input impedance of the N$^{th}$ stage amplifier.

12. The power amplifier of claim 11, wherein the receive band reject filter has an impedance that is between the output impedance of the N−1$^{th}$ stage amplifier and the input impedance of the N$^{th}$ stage amplifier.

13. A power amplifier comprising:
a series of N stage amplifiers, where N≧2;
a series of N−1 interstage networks interposing the series of N stage amplifiers, wherein the series of N−1 interstage networks and series of N stage amplifiers are electrically connected in series; and
wherein the N−1th interstage network includes a receive band reject filter comprising:
a first film bulk acoustic resonator connected to the input of the Nth stage amplifier;
two paths, connected between the first film bulk acoustic resonator and ground, each path including a film bulk acoustic resonator serially connected to an inductor; and
a second film bulk acoustic resonator connected between the first film bulk acoustic resonator and the output of the N−1$^{th}$ stage amplifier.

14. The power amplifier of claim 13, wherein the N−1$^{th}$ interstage network has an input impedance that approximates the output impedance of the N−1$^{th}$ stage amplifier and has an output impedance that approximates the input impedance of the N$^{th}$ stage amplifier.

15. The power amplifier of claim 14, wherein the receive band reject filter has an impedance that is between the output impedance of the N−1$^{th}$ stage amplifier and the input impedance of the N$^{th}$ stage amplifier.

16. A power amplifier comprising:
a series of N stage amplifiers, where N≧2;
a series of N−1 interstage networks interposing the series of N stage amplifiers, wherein the series of N−1 interstage networks and series of N stage amplifiers are electrically connected in series; and
wherein the N−1$^{th}$ interstage network includes a receive band reject filter positioned proximate to the output of the N−1 th stage amplifier, the receive band reject filter comprising:
a first film bulk acoustic resonator connected to the input of the Nth stage amplifier;
a film bulk acoustic resonator serially connected to an inductor, connected between the first film bulk acoustic resonator and ground; and
a second film bulk acoustic resonator connected between the first film bulk acoustic resonator and the output of the N−1$^{th}$ stage amplifier.

17. The power amplifier of claim 16, wherein the N−1$^{th}$ interstage network has an input impedance that approximates the output impedance of the N−1$^{th}$ stage amplifier and has an output impedance that approximates the input impedance of the N$^{th}$ stage amplifier.

18. The power amplifier of claim 17, wherein the receive band reject filter has an impedance that is between the output impedance of the N−1$^{th}$ stage amplifier and the input impedance of the N$^{th}$ stage amplifier.

19. A power amplifier comprising:
a series of N stage amplifiers, where N≧2;
a series of N−1 interstage networks interposing the series of N stage amplifiers, wherein the series of N−1 interstage networks and series of N stage amplifiers are electrically connected in series; and
wherein the N−1$^{th}$ interstage network includes a receive band reject filter positioned proximate to the output of the N−1$^{th}$ stage amplifier, the receive band reject filter comprising a plurality of film bulk acoustic resonators.

\* \* \* \* \*